United States Patent [19]

Kagami et al.

[11] Patent Number: 5,520,297
[45] Date of Patent: May 28, 1996

[54] APERTURE PLATE AND A METHOD OF MANUFACTURING THE SAME

[75] Inventors: Teruyuki Kagami, Hitachioota; Sakae Yaita, Katsuta; Niro Katane; Mitsuo Tanabe, both of Hitachioota; Yoshinori Nakayama, Sayama; Hidetoshi Satoh, Hachiouji, all of Japan

[73] Assignee: Hitachi, Ltd., Tokyo, Japan

[21] Appl. No.: 260,369

[22] Filed: Jun. 14, 1994

[30]     Foreign Application Priority Data

Jun. 23, 1993 [JP] Japan ..................................... 5-151684

[51] Int. Cl.$^6$ ................................ B44C 1/22; C25F 3/00
[52] U.S. Cl. .................... 216/12; 156/630.1; 156/644.1; 216/2; 216/56; 428/131; 430/5; 437/225
[58] Field of Search ........................... 156/630.1, 633.1, 156/643.1, 644.1, 653.1, 662.1, 657.1, 659.11, 661.11; 216/2, 12, 17, 33, 36, 56; 430/5; 437/225; 428/131, 137

[56]             References Cited

U.S. PATENT DOCUMENTS 4,021,276  5/1977  Cho et al. ............................. 156/644
4,417,946  11/1983 Bohlen et al. .......................... 156/644
4,589,952  5/1986  Behringer et al. ...................... 156/644

FOREIGN PATENT DOCUMENTS 60-81875   5/1985  Japan .
2-76216    3/1990  Japan .
4-243118   8/1992  Japan .

*Primary Examiner*—William Powell
*Attorney, Agent, or Firm*—Antonelli, Terry, Stout & Kraus

[57]              ABSTRACT

A semiconductor substrate has a plurality of chip portions and chip separating portions for partitioning the plurality of chip portions into each other. The plurality of chip portions and the separating portions are etched on one side of the semiconductor substrate so that each of the plurality of chip portions is provided with stencil patterns. Furthermore, the plurality of chip portions and chip separating portions are etched on the other side of the semiconductor substrate so that the stencil patterns are exposed and the plurality of chip portions are capable of being substantially separated from each other.

9 Claims, 9 Drawing Sheets

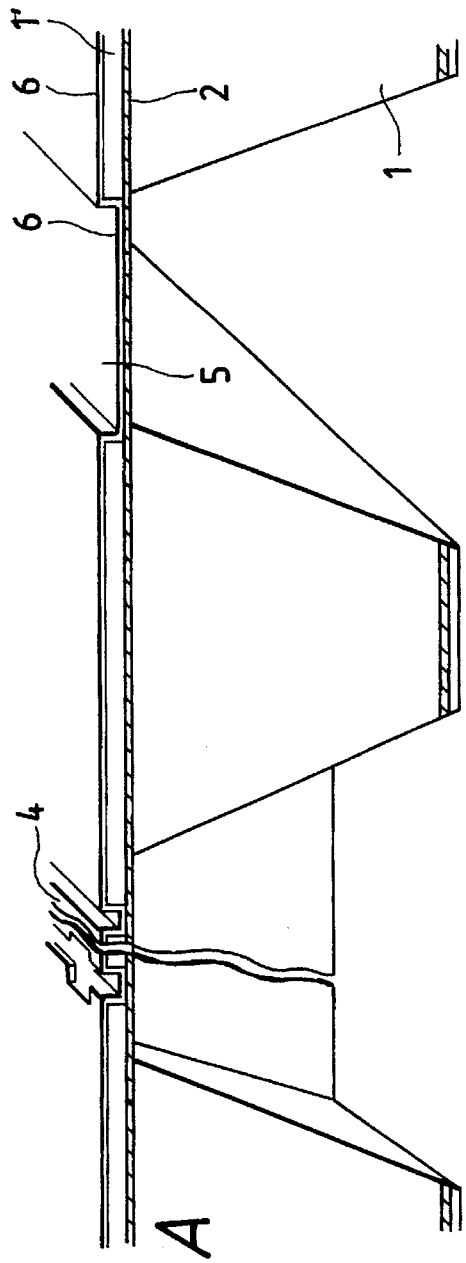
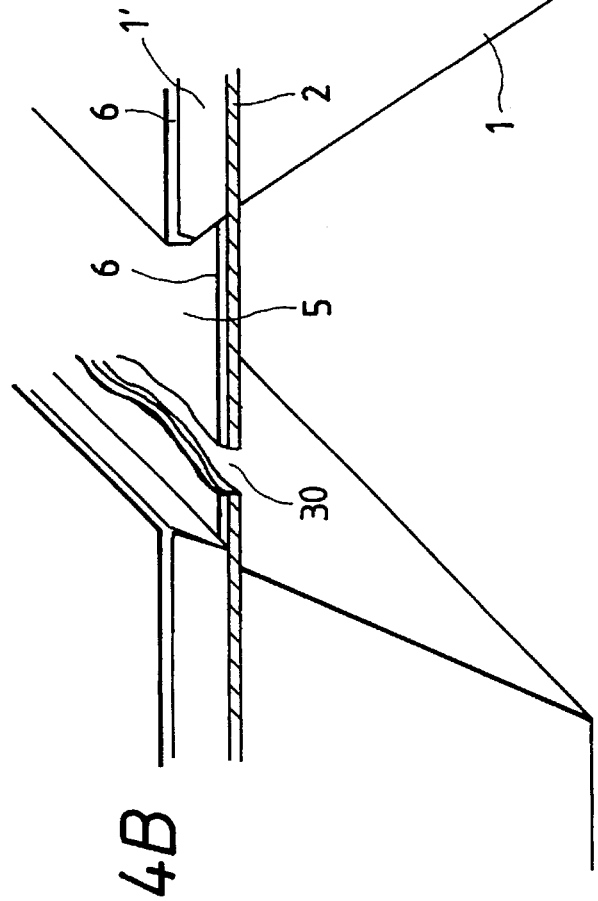

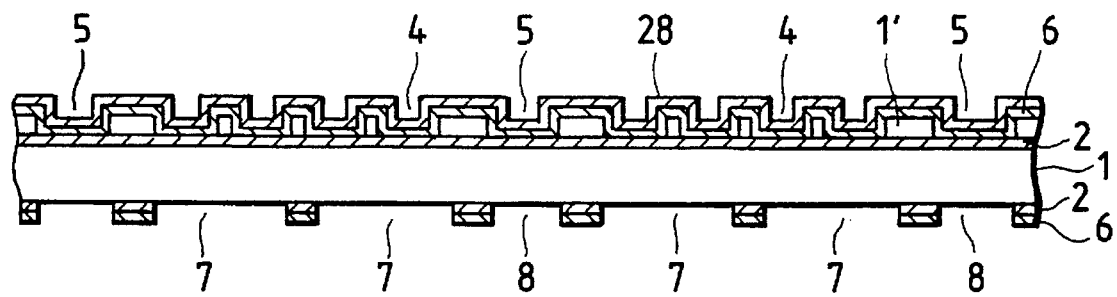
FIG. 13
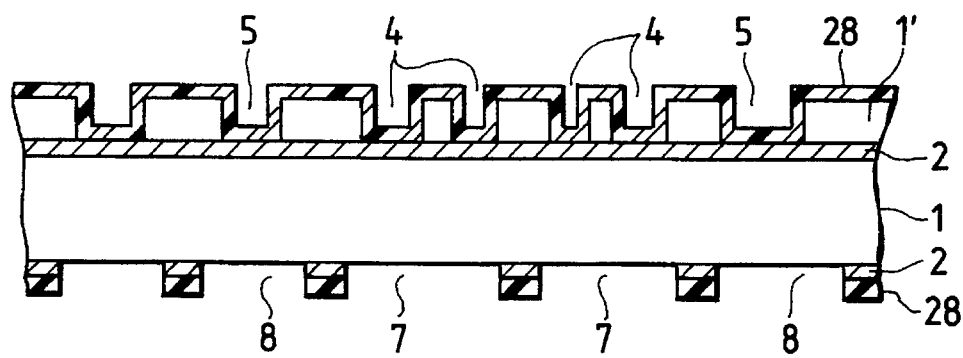
FIG. 14A
FIG. 14B
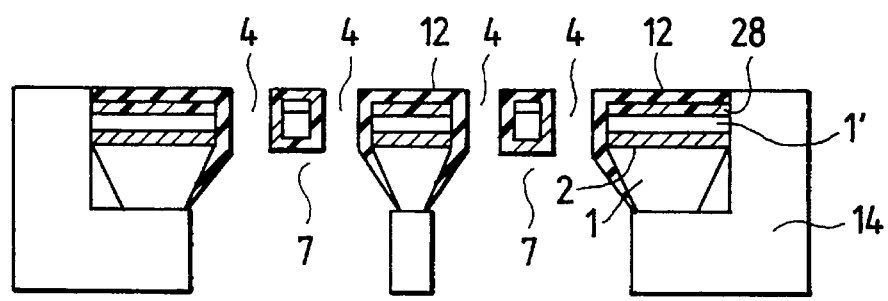

APERTURE PLATE AND A METHOD OF MANUFACTURING THE SAME

BACKGROUND OF THE INVENTION

The present invention relates to an aperture plate and a method for manufacturing the same, and more particularly to an aperture plate suitable for serving as a stencil mask for cell projection lithography and a method manufacturing the aperture plate.

In manufacturing a semiconductor device such as an LSI, an electron-beam lithography system is used to form very fine patterns. An Mo plate is hitherto used for an aperture plate (i.e., transfer or stencil mask) for writing patterns. To improve the throughput, a method of using a stencil mask made of Si having a high forming accuracy for the cell projection lithography method is proposed in Japanese Patent Laid-Open No. 81750/1985, Japanese Patent Laid-Open No. 76216/1990, and Japanese Patent Laid-Open No. 243118/1992.

The following is the description of a flow chart for manufacturing an Si stencil mask proposed in them. A silicon nitride film is formed on one surface of a single-crystalline silicon substrate to remove the silicon nitride film at a portion corresponding to the opening of an aperture plate through etching. A silicon nitride film is formed on the other surface of the substrate and a Ti thin film and an Au thin film are formed in order on the silicon nitride film. A pattern complemental with a mask is formed on the Au thin film with resist, an electron beam absorbing layer is formed by means of Au plating, and the resist is removed. The Au thin film and Ti thin film at the opening of the electron beam absorbing layer are removed by ion etching until the silicon nitride film is exposed and thereafter the exposed portion of the single-crystalline silicon substrate is anisotropically etched by using the silicon nitride film as a protective mask.

Moreover, a stencil mask pattern is formed on one surface of a laminated single-crystalline silicon substrate, and thereafter a pattern facing the stencil mask pattern is opened to form the substrate into chips by dicing. An $Si_3N_4$ film is used to protect the surface stencil mask pattern and mask the opening. Then, the chips are bonded to a glass plate by wax to protect the stencil mask pattern portion on the surface. Then, the chips are put in a KOH aqueous solution (at 75° C.) and anisotropically etched up to a predetermined depth (up to the depth of an oxide film) and washed with water, and then organically washed and separated from the glass plate. A metallic film such as an Au film is formed on the pattern surface to finish the chips.

Moreover, the above Japanese Patent Laid-Open No. 76216/1990 describes a structure in which a thick rib is formed on a stencil mask made of Si. Furthermore, the Japanese Patent Laid-Open No. 243118/1992 discloses a constitution in which an antistatic film is formed.

Thus, a plurality of same stencil masks are formed on the single-crystalline silicon substrate. In the prior art, stencil masks are separated by means of dicing (cutting with a dicing saw).

The existing Si stencil mask producing method has the following problems because a method is used in which stencil masks are diced and separated into chips and the chips are protected by wax. That is, because Si is cut by a dicing saw and separated into chips, Si chips attach to stencil masks. Even if the stencil masks are washed, it is difficult to completely remove the Si chips from the stencil masks. Therefore, when the stencil mask is used in an electron-beam lithography system, the chips result in charge-up or the like.

Even if an antistatic film is formed on the surface of a stencil mask, a serious problem occurs that the antistatic film is separated due to dirt such as Si chips at a high acceleration voltage.

Moreover, for the existing method of protecting a stencil mask with wax and anisotropically etching it, coating must be repeated many time because the wax is not resistive to a hot anisotropic-etching solution at 70° C. or higher such as KOH aqueous solution or the like. Moreover, because the stencil mask is put in and taken out of the etching solution, a problem occurs that dirt attached on an Si stencil mask cannot completely be removed or a defect is produced on the Si stencil mask, and thereby the product yield is not improved.

Moreover, because an $Si_3N_4$ film serving as an inactivation insulating film and silicon substrate are exposed in the case of an existing stencil mask structure, a beam may pass through the film, charge-up may occur, or a stencil mask may be strained by an irradiation beam used due to a difference of stress between support beams of an electron-beam absorbing layer made of Au or the like and $Si_3N_4$.

SUMMARY OF THE INVENTION

It is an object of the present invention to provide an aperture plate free from dirt and with a high yield and a high reliability and a method for manufacturing the aperture plate.

It is another object of the present invention to provide an aperture plate capable of suppressing the strain of an aperture plate by an irradiation beam and a method for manufacturing the aperture plate.

The present invention makes it possible to manufacture an aperture plate by forming a plurality of patterns on a silicon film and moreover forming a fragile portion on the silicon film so as to provide an opening larger than the area of each of the formed patterns.

According to the present invention, an antistatic film is formed on the aperture plate separated into chips from both the sides.

In the above constitution, a shearing force is applied to the fragile portion by, for example, the weight of its own, a pattern portion is cut off, and chips are separated. Therefore, chip separation is made without a step of dicing in a clean process and dirt such as Si chips, wax, or chemicals does not attach to the chip. Moreover, because etching and chip separation are carried out in the state of a wafer, it is possible to decrease the time required to make the an aperture plate.

Furthermore, by forming an antistatic film on both the sides and side walls of a chip, the aperture plate does not cause charge-up or separation of the antistatic film even if it is used on an electron-beam lithography apparatus. Therefore, the yield is not decreased due to defects on the surface. Preferably, by using the silicon as an electron beam absorbing body and a very thin metallic film as an antistatic film, the heat radiation characteristic is improved and a strain due to the heat produced by an applied electron beam can be avoided.

Other objects and features of the present invention will become apparent from the descriptions of the preferred embodiments of the present invention taken in connection with the accompanying drawings.

BRIEF DESCRIPTION OF THE DRAWINGS

FIGS. 4A and 4b are enlarged views of chip pattern portions in the embodiment shown in FIGS. 1A to 1J;

FIG. 13 is a view for explaining the steps of manufacturing an aperture plate of a further additional embodiment according to the present invention;

FIGS. 14A to 14B are views for explaining the steps of manufacturing an aperture plate of still another embodiment according to the present invention.

DESCRIPTION OF THE PREFERRED EMBODIMENTS

An embodiment of an aperture plate suitable to be used as a transfer or stencil mask and an embodiment of the stencil mask producing method of the present invention are described below in detail by referring to FIGS. 1 to 7. The description is made in accordance with the manufacturing steps in FIGS. 1A to 1J and the flow chart shown in FIG. 5.

Figure 1A:
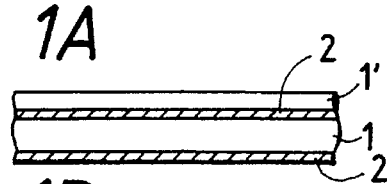
FIGS. 1A to 1J are views for explaining the steps of manufacturing an aperture plate of an embodiment according to the present invention.

FIG. 1A shows a step of preparing a semiconductor substrate composed of a silicon substrate. Specifically, the silicon substrate is made up of an SOI (Silicon On Insulator) bonding single-crystalline silicon substrate, which comprises a single-crystalline silicon substrate 1 with the plane orientation (100) whose upper and lower surfaces are mirror-finished, Si oxide films 2 formed on the upper and lower surfaces of the single-crystalline silicon substrate 1 and a single-crystalline silicon film 1' with the plane orientation (100) formed on the silicon oxide film 2 on the upper surface of the single-crystalline Si substrate 1 (S1 in FIG. 5). The silicon substrate 1, the silicon film 1' and the silicon oxide film 2 are on the order of 500 µm, 20 µm and 1µ in thickness, respectively. The semiconductor substrate is imaginarily divided into a plurality of chip portions in a matrix, which are imaginarily partitioned by chip separating portions, respectively.

Figure 1B:
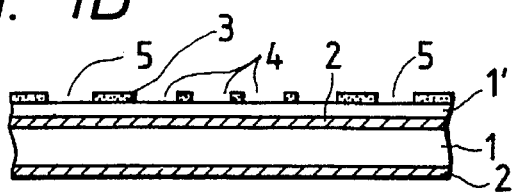

A multi-layer resist film 3 having a thickness of 4 µm is formed on the upper surface of the semiconductor substrate (S2 in FIG. 5) and is subjected to an electron beam exposure so as to form stencil patterns on each of the portions of the resist film 3 which correspond to the chip portions of the semiconductor substrate and to form chip separating patterns representative of the chip separating portions of the semiconductor substrate on the corresponding portions of the resist film 3. Thereafter, the semiconductor substrate is dipped in a developing solution to establish the stencil patterns and the chip separating patterns as shown in FIG. 1B (S3 in FIG. 5). In FIG. 1B, numeral 4 shows the stencil patterns and Numeral 5 the chip separating patterns. In practice, there are provided a alignment pattern, apparatus adjusting pattern, accuracy confirmation pattern, FG pattern of a process pattern used for IC or LSI, wiring pattern, and diffusion pattern. However, these patterns are omitted in the FIGS. for the sake of simplicity.

Figure 1C:
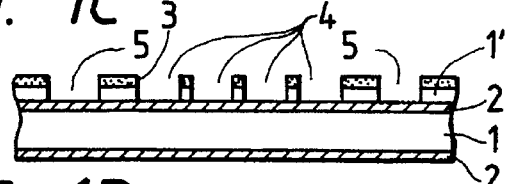
Figure 5:
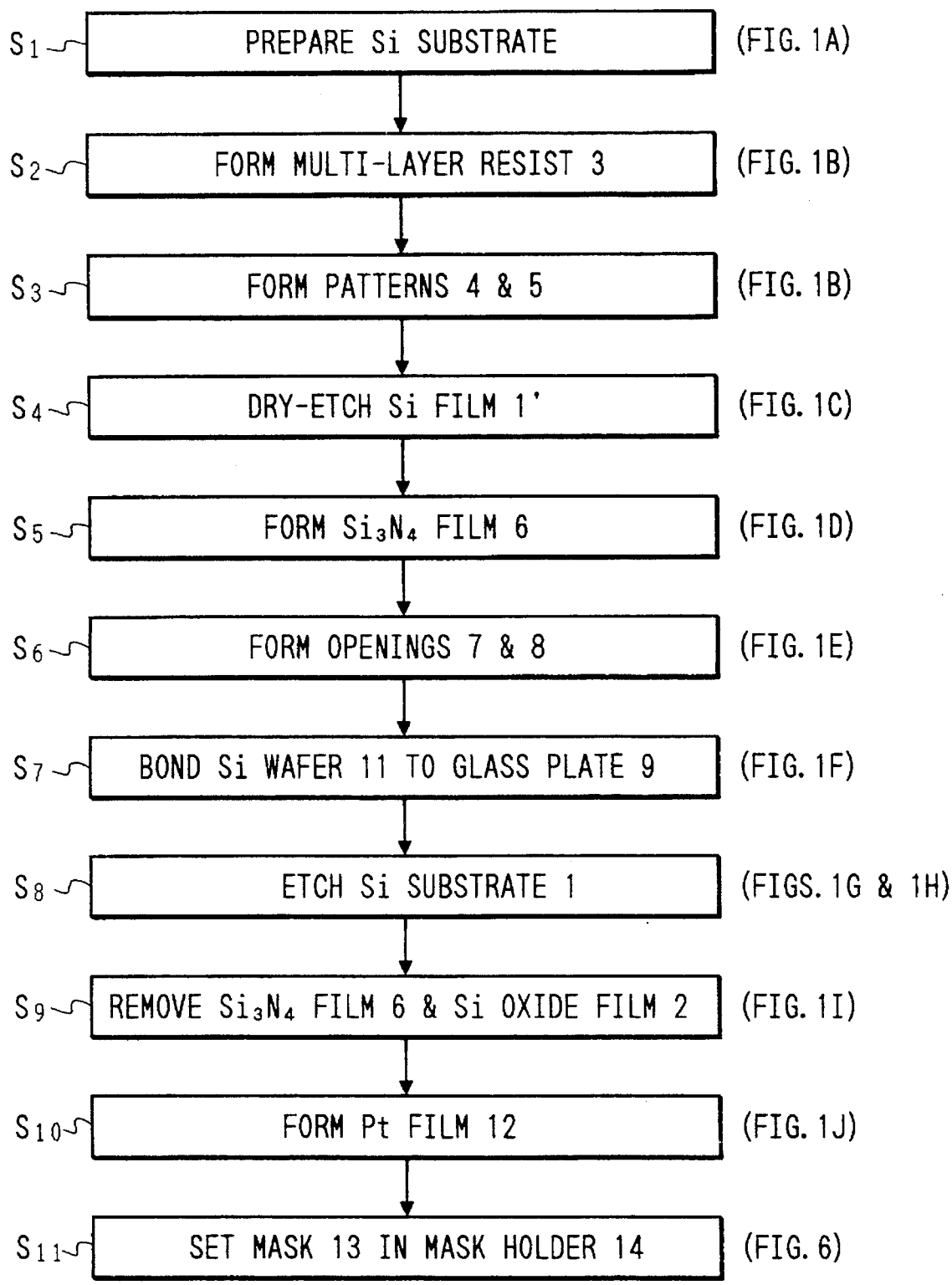
FIG. 5 is a flow chart of the aperture plate manufacturing process in the embodiment shown in FIGS. 1A to 1J.

As shown in FIG. 1C, the silicon film 1' is dry-etched so as to remove the portions thereof corresponding to the stencil patterns 4 and the chip separating pattern 5 (S4 in FIG. 5). The width for dry-etching the silicon film 1' ranges between 1 µm and 2 mm.

Figure 1D:
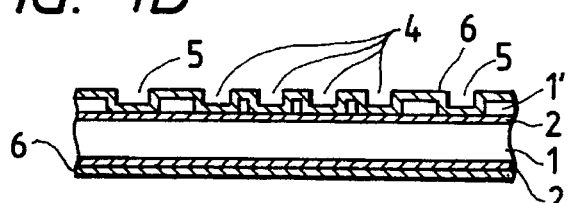

As shown in FIG. 1D, a $Si_3N_4$ film 6 having a thickness of 200 nm is formed on both the surfaces of the semiconductor substrate by a CVD method at 750° C. after removing the resist film 3 (S5 in FIG. 5).

Figure 1E:
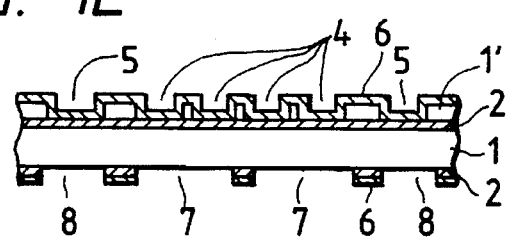

As shown in FIG. 1E, the $Si_3N_4$ film 6 and the silicon oxide film 2 on the lower side of the semiconductor substrate are etched to have openings 7 facing the stencil patterns 4 and openings 8 facing the chip separating patterns (S6 in FIG. 5). In this case, dry-etching and acid etching may be used for removing the films 6 and 2, respectively. Furthermore, a double-side aligner may be used for aligning the openings 7 and 8 with the stencil patterns 4 and the chip separating patterns 5, respectively.

Figure 1F:
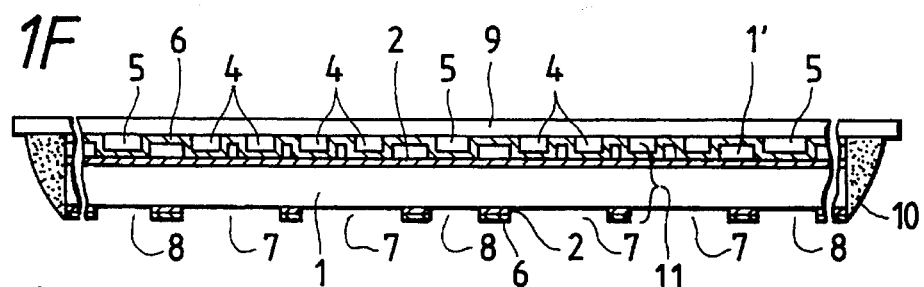
Figure 1G:
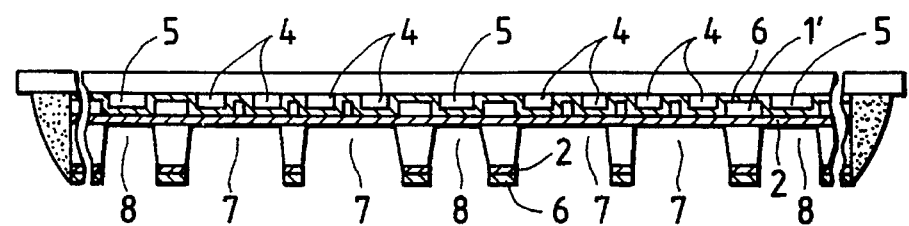

As shown in FIG. 1F, the silicon wafer 11 made thus is bonded to a glass plate 9 with a silicon sealing agent 10 so as to protect the stencil patterns 4 and the chip separating patterns 5 (S7 in FIG. 5).

Figure 2:
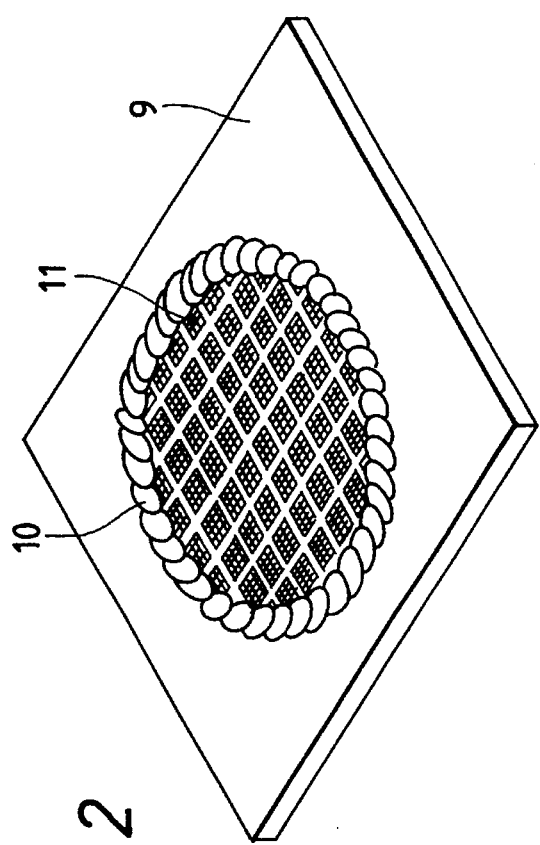
FIG. 2 is a perspective view showing a state in which the Si wafer for the aperture plate of the embodiment shown in FIGS. 1A to 1J is bonded and sealed.

FIG. 2 shows a state in which a patterned silicon wafer 11 is bonded to the glass plate 9 shown in FIG. 1F so as to be sealed by the silicon sealing agent 10.

The silicon wafer 11 bonded to the glass plate 9 is dipped in an anisotropic etching solution (KOH aqueous solution at 70° C.) to etch the silicon substrate 1 until the openings 7 reaches the silicon oxide film 2 and the openings 8 reaches or approaches the silicon oxide film 2 (FIG. 1G)(S8 in FIG. 5).

Figure 1H:
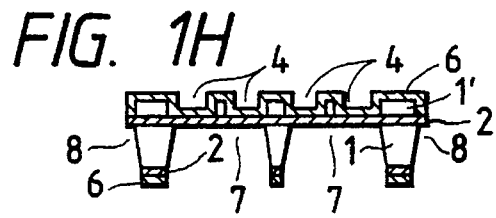
Figure 3:
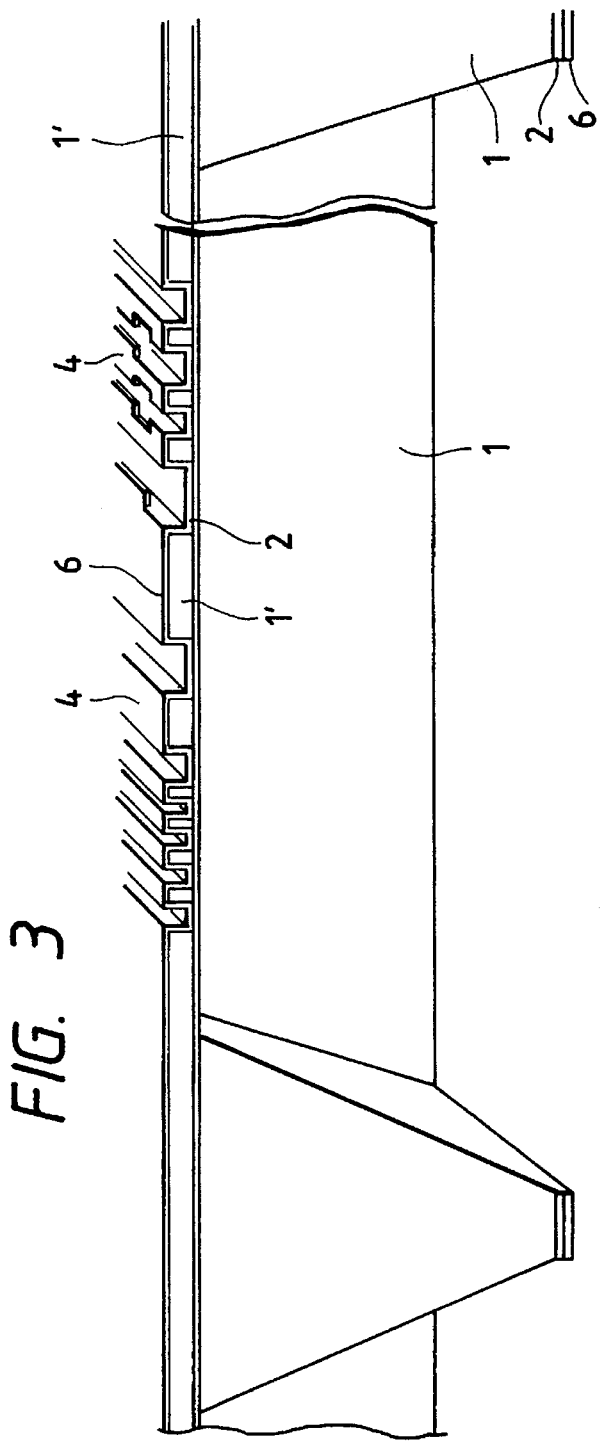
FIG. 3 is an enlarged view of stencil pattern portions in the embodiment shown in FIGS. 1A to 1J.

In this case, the states of the stencil patterns 4 and the chip separating patterns 5 are as shown in FIGS. 3 and 4, respectively. As apparent from FIG. 3, the stencil patterns 4 are partitioned by the non-etched portions of the silicon film 1' having a thickness of 20 µm. The non-etched portions are arranged with a comparatively high density because the stencil patterns are densely formed. Therefore, the mechanical strength of the stencil pattern portions is not very small. As seen from FIG. 4, however, the chip separating pattern portions 5 are formed only by the $Si_3N_4$ film 6 and the silicon oxide film 2 (these films are very thin) and do not contain the silicon film 1' at all and therefore, these portions are considerably small in mechanical strength and fragile. Therefore, when anisotropic etching progresses and the silicon film 1 is removed, the chip separating portions cause shear fracture because they do not withstand the chip weight, whereby the chip portions are separate from each other. One chip portion separated thus is shown in FIG. 1H.

Figure 1I:
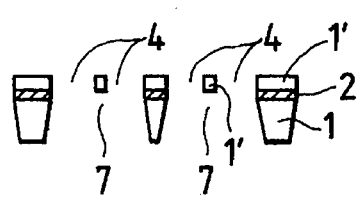
Figure 1J:
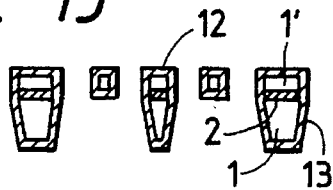
Figure 6:
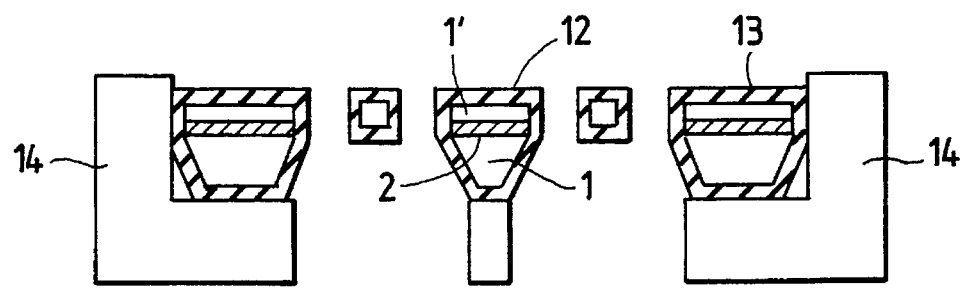
FIG. 6 is a view showing a state in which an aperture plate is set in a holder in the embodiment shown in FIGS. 1A to 1J.

Thereafter, as shown in FIG. 1I, the $Si_3N_4$ film 6 and the silicon oxide films 2 are removed by acid etching and washed and dried (S9 in FIG. 5). Then, a Pt film 12 containing 2% of Pd serving as an antistatic film is formed on the whole surface of the stencil pattern portions by sputtering (S10 in FIG. 5) to form an aperture plate 13 as shown in FIG. 1J. The aperture plate 13 formed thus is set in an aperture plate holder 14 as shown in FIG. 6 (S11 in FIG. 5) and mounted on an electron-beam lithography system as shown in FIG. 7.

The aperture plate is carefully washed when removing the $Si_3N_4$ film 6 and silicon oxide film 2. Therefore, no foreign matter of 0.1 μm or more is observed at the top and bottom of the antistatic film. Thus, even after irradiating the aperture plate with an electron beam having an acceleration voltage of 50 kV for 3,000 hr more continuously, no antistatic-film separation or deterioration due to charge-up occurs (acquisition rate: existing value of 30%→98% for this embodiment).

In place of coating the whole aperture plate 13 with the Pt material prior to setting the aperture plate 13 in the holder 14, the aperture plate 13 may be coated with the Pt material along with the holder 14 after being set therein.

Figure 7:
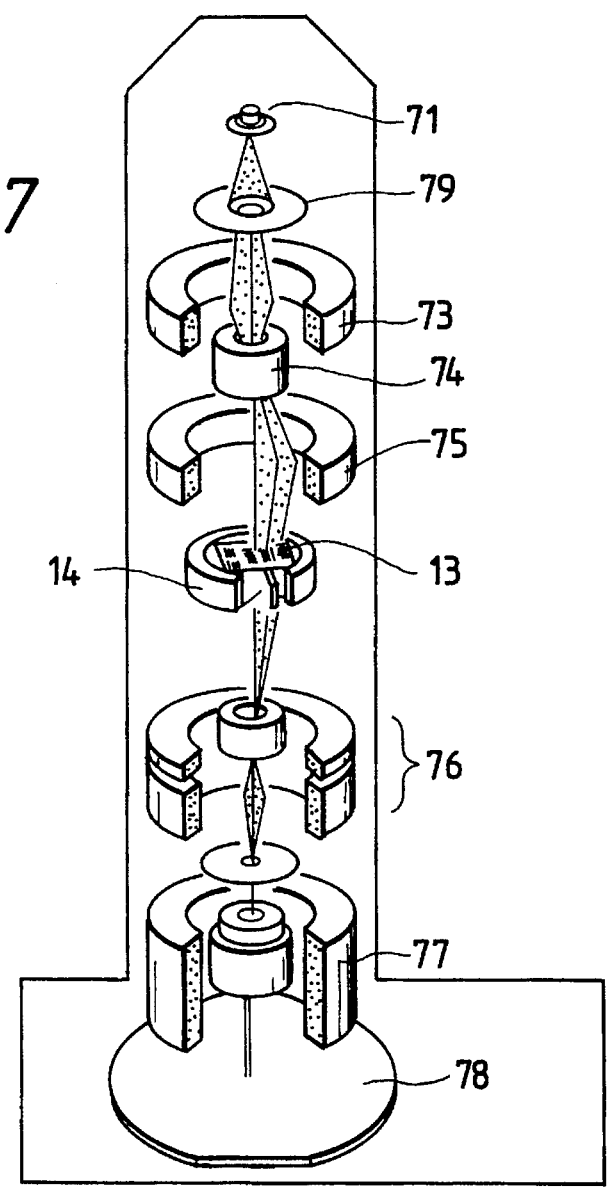
FIG. 7 is conceptual view of a cell-projection-type electron beam lithography system in which the aperture plate of the embodiment shown in FIGS. 1A to 1J is used.

Referring to FIG. 7, an electron beam emitted from an electron gun 72 is focused by lenses 73 and 75 so as to produce an aperture image of a first aperture plate 79 on an image plane on which a second aperture plate or stencil mask 13 supported by the holder 14 is disposed. An irradiating position on the image plane with the electron beam can be determined by deflecting the electron beam with a deflector 74. An image on the image plane is formed on a wafer 78 by lenses 76 and 77.

The stencil mask 13 is provided with stencil patterns as explained in connection with FIGS. 1 to 6. Therefore, the stencil patterns are formed on the wafer 78 by the lenses 76 and 77.

Figure 8:
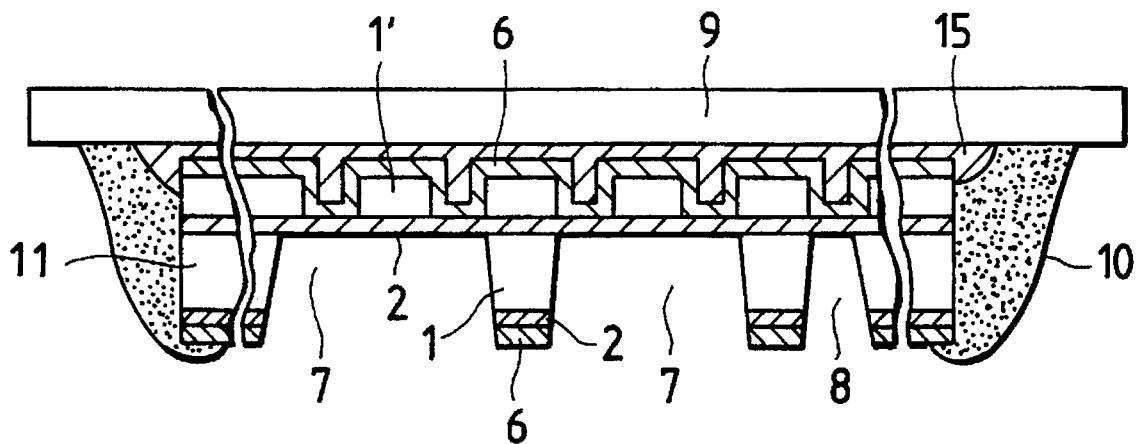
FIGS. 8 and 9 are views for explaining an aperture plate manufacturing method of another embodiment according to the present invention.
Figure 9:
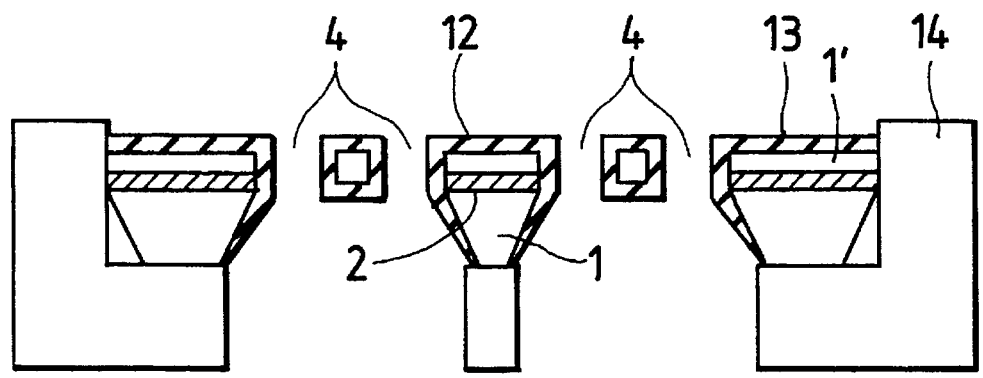

Explaining another embodiment according to the invention referring to FIGS. 8 and 9, the steps of FIGS. 1A to 1E are applied to this embodiment.

Thereafter, as shown in FIG. 8, the wafer 11 is bonded to a glass plate 9 by wax 15 to protect the stencil patterns 4 and the chip separating patterns 5 and sealed by a sealing agent 10 made of silicon. Thereafter, the wafer 11 is anisotropically etched through the same steps as those of the embodiment explained in connection with FIGS. 1A to 1J and separated into chips and washed and dried. Then, similarly to the embodiment explained in connection with FIGS. 1A to 1J, the metallic film 12 serving as an antistatic film is formed on the whole surface of the stencil patterns 4 to form the aperture plate 13.

It is also possible to form the metallic film serving as an antistatic film after setting it in the holder 14. Even if the aperture plate as shown in FIGS. 8 and 9 is used, its reliability is not degraded. Of course, no foreign matter is observed at the top and the bottom of the antistatic film.

Even after irradiating the aperture plate with the electron beam having the acceleration voltage of 50 kV for 3,000 hr or more continuously, no antistatic-film separation or deterioration due to charge-up occurs. Thus, the aperture plate with a high reliability is obtained.

Figure 10A:
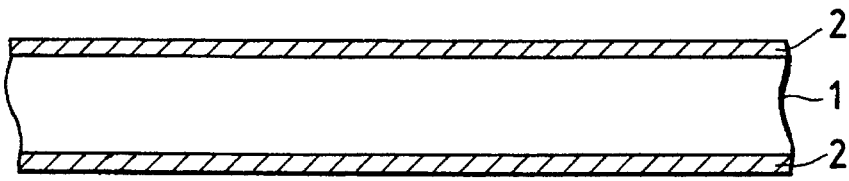
FIGS. 10A to 10F are views for explaining the steps of manufacturing an aperture plate of an additional embodiment according to the present invention.

Explaining an additional embodiment of the invention in connection with FIGS. 10A to 10F, a semiconductor substrate is prepared which comprises a single-crystalline silicon substrate 1 having the plane orientation (100) and silicon oxide films 2 formed on the upper and lower surfaces thereof by thermal oxidation as shown in FIG. 10A. The semiconductor substrate is imaginarily divided into a plurality of chip portions in a matrix, which are imaginarily partitioned by chip separating portions, respectively.

Figure 10B:
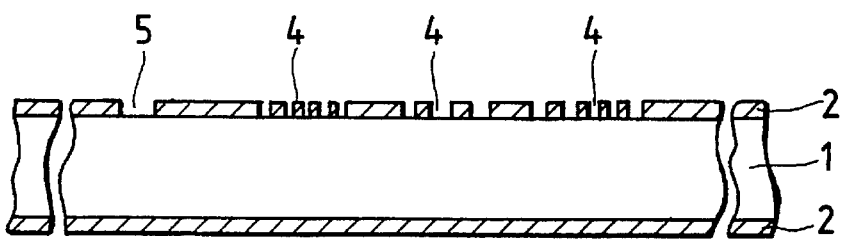

A multi-layer resist film is formed on the upper surface of the semiconductor substrate is subjected to an electron beam exposure so as to form stencil patterns on each of the portions of the resist film which correspond to the chip portions of the semiconductor substrate and to form chip separating patterns representative of the chip separating portions of the semiconductor substrate on the corresponding portions of the resist film. Thereafter, the semiconductor substrate is dipped in a developing solution to establish the stencil patterns and the chip separating patterns. The resist film and the silicon oxide film 2 are dry-etched so as to remove the portions thereof corresponding to the stencil patterns and the chip separating pattern 5. Thereafter, the resist film is removed, whereby the etched stencil patterns 4 and the etched chip separating patterns 5 are formed as shown in FIG. 10B.

Figure 10C:
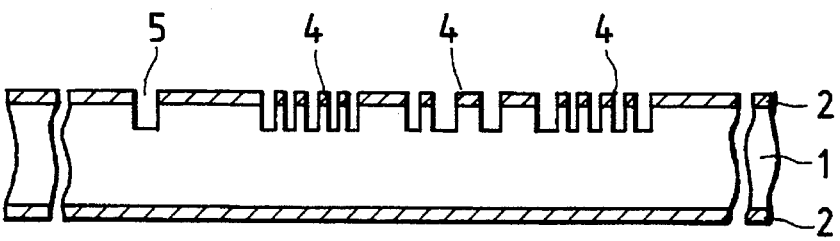

As shown in FIG. 10C, the silicon substrate 1 is dry-etched using the non-etched portions of the silicon oxide film 2 as masks so that the stencil patterns 4 and chip separating patterns 5 have a predetermined depth.

Figure 10D:
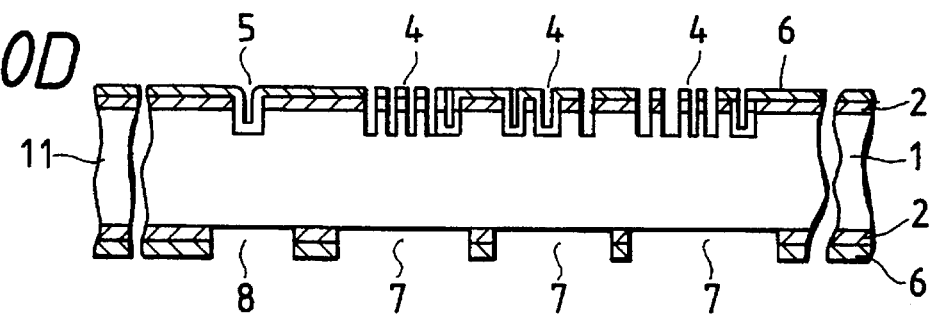

Thereafter, as shown in FIG. 10D, an $Si_3N_4$ film 6 having a thickness of 350 nm is formed on the upper and lower surfaces of the semiconductor substrate as shown in FIG. 10C by a CVD method at 750° C. Furthermore, the films 6 and 2 on the lower side of the semiconductor are etched to have openings 7 facing the stencil patterns 4 and openings 8 facing the chip separating patterns 5 as shown in FIG. 10D.

Similarly to the embodiment described in connection with FIG. 8, the wafer 11 is bonded to the glass plate 9 by the wax 15 in order to protect the stencil patterns 4 and the chip separating patterns 5 and sealed by the silicon sealing agent 10.

Thereafter, the wafer 11 bonded to the glass plate 9 is dipped in an anisotropic-etching solution to etch the silicon substrate 1 until the openings 7 reaches the stencil patterns 4 and the openings 8 reaches or approaches the chip separating patterns 5.

Figure 10E:
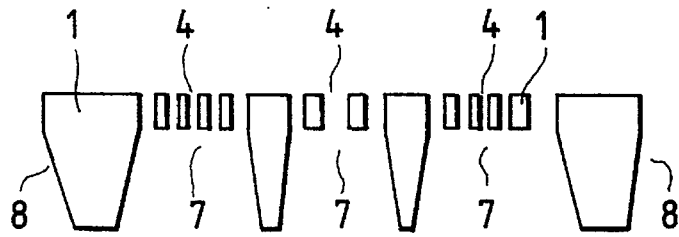

After etching, the wax is melted to separate the chips from the glass plate 9 and wash the chips. Then, as shown in FIG. 10E, the $Si_3N_4$ film 6 and the silicon oxide film 2 are removed by etching and the chips are carefully washed.

The chip manufactured thus, i.e. aperture plate, is free from Si chips due to dicing or dirt due to repeated coating of wax.

Figure 10F:
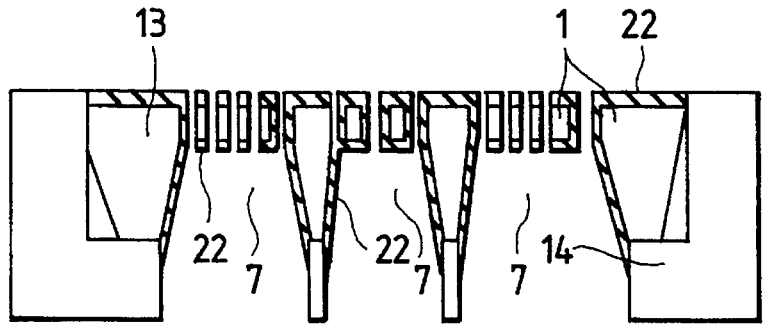

As shown in FIG. 10F, the aperture plate is set in the holder 14 and a tungsten silicide film 22 serving as an antistatic film is formed on both of the aperture plate and the holder.

Even after the aperture plate is mounted on an electron-beam lithography system and irradiated with a 50-kV electron beam for 3,000 hr continuously, separation of the antistatic film or deterioration due to charge-up does not occur.

Figure 11:
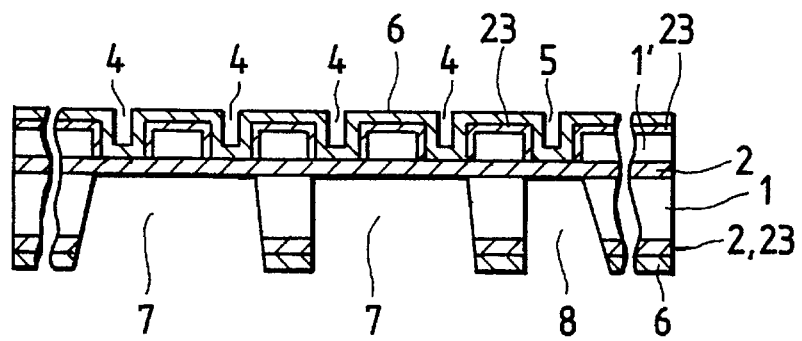
FIG. 11 is a view for explaining the steps of manufacturing an aperture plate of yet another embodiment according to the present invention.

Turning to yet another embodiment of the invention shown in FIG. 11, this embodiment is substantially the same as the embodiments explained in connection with FIGS. 1A to 1J and FIG. 8 except that a silicon oxide film 23 having a thickness of 200 nm is formed on the upper surface of the semiconductor substrate by a CVD method before the $Si_3N_4$ film 6 is formed and an Au film is used as a antistatic film. The $Si_3N_4$ film is weak in stress and cracks easily occur. these problems can be solved by using the silicon oxide film 23 together with the $Si_3N_4$ film 6.

Figure 12A:
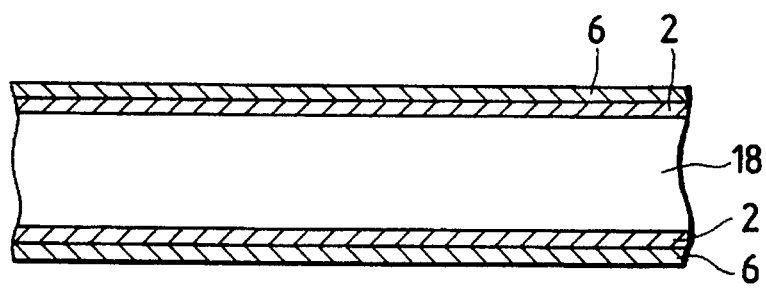
FIGS. 12A to 12C are views for explaining the steps of manufacturing an aperture plate of a further embodiment according to the present invention.
Figure 12B:
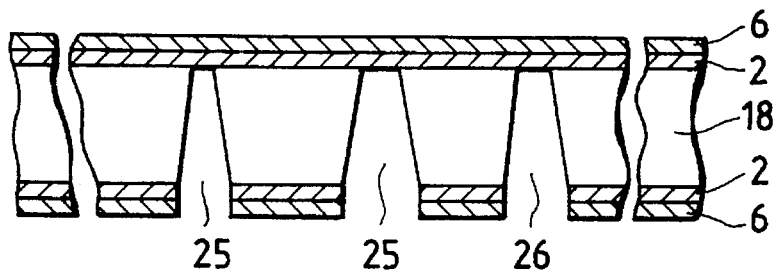
Figure 12C:
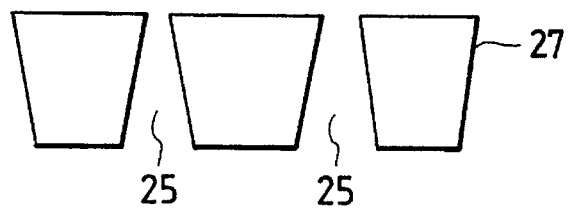

Explaining a further embodiment of the invention referring to FIGS. 12A to 12C, a semiconductor substrate shown in FIG. 12A comprises a single-crystalline silicon substrate 18 (500 μm) having the plane orientation (100), silicon oxide films 2 (1.2 μm) formed on the upper and lower surfaces thereof and $Si_3N_4$ films 6 (0.3 μm) formed on the respective silicon oxide films 2. The semiconductor substrate is imaginarily divided into a plurality of chip portions in a matrix, which are imaginarily partitioned by chip separating portions, respectively.

A multi-layer resist film is formed on the lower surface of the semiconductor substrate and is subjected to an electron beam exposure so as to form stencil patterns or at least one electron beam aperture on each of the portions of the resist film which correspond to the chip portions of the semiconductor and to form chip separating patterns representative of the chip separating portions of the resist film. Thereafter, the semiconductor substrate is dipped in a developing solution to establish the stencil patterns or the at least one electron beam aperture and the chip separating patterns. Subsequently, the films 6 and 2 are etched so as to remove the portions thereof corresponding to the stencil patterns or the at least one electron beam aperture and the chip separating patterns. Furthermore, after the resist film being removed, the silicon substrate 18 is etched until the stencil patterns or the at least one electron beam aperture and the chip separating patterns reach the silicon oxide film 2 on the upper side of the semiconductor substrate. In FIG. 12B, the stencil patterns or the at least one electron beam aperture and the chip separating patterns are designated by numerals 25 and 26, respectively.

Thereafter, films 6 and 2 are removed by anisotropic etching and washed, whereby an aperture plate 27 shown in FIG. 12C is obtained. The aperture plate may be coated with an antistatic material such as Pt containing Pd. The aperture plate made thus may be used as a stencil mask of electron beam lithography systems or an electron beam aperture plate of scanning electron microscopes.

Explaining a further additional embodiment of the invention referring to FIG. 13, this embodiment is substantially the same as the embodiment explained in connection with FIGS. 1A to 1J or FIGS. 8 and 9 except that, after the step shown in FIG. 1E but before the step shown in FIG. 1F, a tungsten film 28 preventing charge-up is formed on the film 6 on the upper side of the semiconductor substrate.

Explaining still another embodiment of the invention referring to FIGS. 14A and 14B, this embodiment is substantially the same as the embodiment explained in connection with FIGS. 1A to 1J except that, after the step shown in FIG. 1E but before the step shown in FIG. 1F, the film 6 is removed and a tungsten film 28 is formed instead thereof and the aperture plate is coated with Pt containing 2% Pd after being set in the holder 14.

The present invention provides a high-reliability an aperture plate by manufacturing it in accordance with a semiconductor process producing method with less foreign matter.

That is, the present invention provides an aperture plate free from Si chips or foreign matter by forming stencil patterns and a chip area through dry etching, anisotropically etching a wafer collectively by using a two-layer structure comprising a silicon oxide film and an $Si_3N_4$ film as an aperture plate, and forming chips.

As the result of performing an experiment in which an aperture plate made by separating it into chips without using anisotropic etching is mounted on an electron-beam lithography system for cell-projection lithography and irradiated with an electron beam at the acceleration voltage of 50 kV, charge-up occurs after the aperture plate is irradiated with the electron beam for 70 hr continuously. For the chip-separated Si aperture plate of the present invention free from foreign matter and made by anisotropic etching of a water in bulk, however, antistatic-film separation or charge-up does not occur even after continuous irradiation with an electron beam for 3,000 hr or more at the acceleration voltage of 50 kV. Thereby, it is found that the service life is increased 40 times or more by the present invention.

Moreover, for the present invention, chips of an aperture plate can be obtained from a wafer in bulk at the yield of 95% or more and the time for obtaining chips can greatly be decreased. However, for the existing anisotropic etching of chips protected by wax after dicing, using a mask made of only an $Si_3N_4$ film weak in stress, external defects are found in 12 chips among 20 ones. Therefore, the yield is 60%.

Moreover, the present invention makes it possible to provide an aperture plate free from antistatic-film separation or charge-up by forming a metallic film serving as an antistatic film on both the sides and the side wall of the aperture plate free from foreign matter to form a fine pattern of, for example, a large-capacity DRAM. Therefore, high-accuracy cell-projection lithography is realized.

Since it is obvious that many changes and modifications can be made in the above described details without departing from the nature and spirit of the invention, it is to be understood that the invention is not to be limited to the details described herein.

What is claimed is:

1. An aperture plate having patterns formed on silicon and a fragile portion with an opening larger than the area of each of the patterns.

2. An aperture plate having pattern portions formed on silicon and a fragile portion with less strength than that of each of the pattern portions.

3. A substrate having patterns and a fragile portion having an opening larger than the area of each of the patterns.

4. A method of manufacturing an aperture plate, comprising the steps of:

preparing a semiconductor substrate, the semiconductor substrate having a plurality of chip portions and chip portion separating portions for partitioning the plurality of chip portions into each other;

forming patterns on each of the plurality of chip portions; and etching the chip portion separating portions to separate the plurality of chip portions from each other.

5. A method of manufacturing an aperture plate, comprising the steps of:

preparing a semiconductor substrate, the semiconductor substrate having a plurality of chip portions and chip portion separating portions for partitioning the plurality of chip portions into each other;

etching the plurality of chip portions and the chip portion separating portions on one side of the semiconductor substrate so that each of the plurality of chip portions is provided with stencil patterns; and etching the plurality of chip portions and chip portion separating portions on the other side of the semiconductor substrate so that the stencil patterns are exposed and the plurality of chip portions are capable of being substantially separated from each other.

6. A method of manufacturing an aperture plate according to claim 5, further comprising the step of coating the separated chip portions with an antistatic material.

7. A method of manufacturing an aperture plate, comprising the steps of:

preparing a semiconductor substrate, the semiconductor substrate having a plurality of chip portions and chip portion separating portions for partitioning the plurality of chip portions into each other; and etching the plurality of chip portions and the chip portion separating portions so that the chip portions are substantially separated from each other and each thereof has stencil patterns.

8. A method of manufacturing an aperture plate, comprising the steps of:

preparing a semiconductor substrate, the semiconductor substrate having a plurality of chip portions and chip portion separating portions for partitioning the plurality of chip portions into each other; and etching the plurality of chip portions and the chip portion separating portions so that the chip portions are substantially separated from each other and each thereof has an aperture.

9. A substrate having pattern portions and a fragile portion with less strength than that of each of the pattern portions.

* * * * *